United States Patent [19]

Suzuki

[11] Patent Number: 4,847,549

[45] Date of Patent: Jul. 11, 1989

[54] SWITCHING VOLTAGE REGULATOR WITH STABILIZED LOOP GAIN

[75] Inventor: Hidehiko Suzuki, Tokyo, Japan

[73] Assignee: National Semiconductor Corporation, Santa Clara, Calif.

[21] Appl. No.: 240,319

[22] Filed: Sep. 6, 1988

[51] Int. Cl.[4] .......................................... H02M 3/156
[52] U.S. Cl. .................................... 323/288; 307/228; 323/299
[58] Field of Search ....................... 323/288, 282, 299; 307/228, 356

[56] References Cited

U.S. PATENT DOCUMENTS

| 4,413,237 | 11/1983 | Baba | 307/228 |
| 4,459,539 | 7/1984 | Cordy | 323/288 |
| 4,546,421 | 10/1985 | Bello et al. | 323/288 |

OTHER PUBLICATIONS

Calvo et al, "Circuit to Linearize the Control Loop of a Switching Voltage Regulator", IBM Tech. Discl. Bul., vol. 22, No. 6, pp. 2191–2192, Nov. 1979.
Owen, "Function Generator," IBM Tech. Discl. Bul., vol. 3, No. 3, p. 40–1, Jul. 1960.

*Primary Examiner*—William H. Beha, Jr.
*Attorney, Agent, or Firm*—Mark Aaker; Lee Patch; Gail Woodward

[57] ABSTRACT

A switching voltage regulator is stabilized against changes in input voltage by suppressing the increase in loop gain due to increased input voltage. The reduction of loop gain is achieved by use of a modified triangle waveform which is compared to an error signal to switch the regulator output stage.

5 Claims, 7 Drawing Sheets

SWITCHING VOLTAGE REGULATOR WITH STABILIZED LOOP GAIN

FIELD OF THE INVENTION

This invention relates to electronic voltage regulators, particularly switching voltage regulators. Voltage regulators are widely used in electronic equipment to provide a stable fixed output voltage to other electronic circuitry. Switching voltage regulators can operate more efficiently than other conventional voltage regulators since they only switch on to draw power as needed, rather than continuously dissipating or drawing upon the input voltage. This invention increases the stability of operation of a switching voltage regulator.

DESCRIPTION OF RELATED ART

FIG. 1 shows a block diagram of a switching voltage regulator known in the art. The switching voltage regulator is supplied with an input voltage $V_{in}$ at input pin 10, and provides an output voltage $V_{out}$ at output pin 12. In a buck type switching regulator, filtering components 14 assist in producing a stable fixed output voltage to a load 15, which is usually other electronic circuitry requiring a fixed voltage less than the input voltage $V_{in}$.

The switching voltage regulator includes an error amp 16, an oscillator 18, a comparator 20, and an output stage 22.

A feedback signal $V_{feedback}$ is developed as a fractional portion of the output voltage $V_{out}$. This feedback signal $V_{feedback}$ can be developed at a center node 24 of a voltage divider composed of resistors 26 and 28 connected from the output voltage $V_{out}$ to ground. This feedback signal $V_{feedback}$ is carried along a feedback connection 30 to the error amp 16.

The error amp 16 has a first input 32 for receiving the feedback signal $V_{feedback}$ on the feedback connection 30. A second error amp input 34 receives a reference voltage $V_{ref}$ from a voltage reference 36. The error amp 16 subtracts a reference voltage $V_{ref}$ and amplifies to produce an error voltage $V_{error}$ at the error amp output 38.

The oscillator 18 generates a repeating or periodic oscillator signal $V_{osc}$ at an oscillator output 40. The oscillator signal $V_{osc}$ is commonly a sawtooth wave or triangle wave of a frequency between 10 to 100 KHz.

The comparator 20 has a first 42 for receiving the error signal $V_{error}$ from error amp output 38. The second comparator input 44 receives the oscillator signal $V_{osc}$ from oscillator output 40. The comparator 20 produces a control signal $V_{control}$ at the comparator output 46.

The output stage 22 receives the control signal $V_{control}$ at its input 48. The output stage is supplied at input pin 10 with input voltage $V_{in}$, and switches on and off to provide output voltage $V_{out}$ at the output pin 12.

In operation, a drop in the output voltage $V_{out}$ below the desired value also reduces the feedback signal $V_{feedback}$ developed from the output voltage $V_{out}$. The reduced feedback signal $V_{feedback}$ is returned by the feedback connection 30 to the error amp 16. The reduced feedback signal $V_{feedback}$ produces a reduced error signal $V_{error}$. This reduced error signal $V_{error}$ is applied to the comparator 20.

FIG. 2 shows the signals at the comparator 20. The oscillator signal $V_{osc}$ is a periodically rising and falling signal, such as the triangle wave shown. The error signal $V_{error}$ sets a threshold level. Whenever the oscillator signal $V_{osc}$ exceeds the error signal $V_{error}$, the comparator triggers and produces the control signal $V_{control}$. As long as the oscillator signal $V_{osc}$ exceeds the error signal $V_{error}$, the control signal $V_{control}$ is produced.

Since the oscillator signal $V_{osc}$ is a periodically rising and falling signal, the control signal $V_{control}$ is produced for some fractional period of each oscillator cycle, starting at the point at which the oscillator signal $V_{osc}$ rises above the error signal $V_{error}$, and ending when the oscillator signal $V_{osc}$ falls below the error signal $V_{error}$. The level of the error signal $V_{error}$ controls how long in each cycle the control signal $V_{control}$ is produced.

Therefore, when the error signal $V_{error}$ falls, the threshold moves lower and the oscillator signal $V_{osc}$ exceeds the error signal $V_{error}$ earlier in the cycle, and remains above it for longer in the cycle. Therefore, the control signal $V_{control}$ pulses will be wider. These wider control signal $V_{control}$ pulses activate the output stage 22 for longer periods of time. This longer amount of time produces a larger output voltage $V_{out}$, thereby correcting for the original drop in the output voltage $V_{out}$.

Similarly, if the output voltage $V_{out}$ rises, the feedback signal $V_{feedback}$ and error signal $V_{error}$ also rise, and the pulses of the control signal $V_{control}$ become narrower. The output stage 22 is activated for shorter periods of time, and the output voltage $V_{out}$ falls back toward the desired level.

This technique is also known as pulse width modulation, since the width of the pulses output from the comparator 20 is controlled by the level of the error signal.

The switching voltage regulator of FIG. 1 has a certain degree of responsiveness to changes in the output voltage $V_{out}$. This degree of responsiveness is determined by several factors, including:

(a) the fraction of the output voltage $V_{out}$ fed back to the error amp;
(b) the gain of the error amp 16;
(c) the peak to peak voltage of the oscillator signal $V_{osc}$;
(D) the level of the input voltage $V_{in}$.

The overall degree of responsiveness established by these factors can be characterized as the loop gain, $A_{loop}$, of the circuit. Variations in the loop gain as these factors change can be undesirable for stable operation of the voltage regulator. In particular, loop gain changes due to changes in input voltage $V_{in}$ are undesirable.

In switching voltage regulators it is desirable that the circuit work over a broad range of input voltage $V_{in}$, for example from 8 volts to 45 volts. Because the input voltage $V_{in}$ is one of the main factors affecting the circuit responsiveness; if $V_{in}$ increases the loop gain, $A_{loop}$, will also increase, typically by a ratio of 45 divided by 8, or 15 dB if other factors are held constant.

The loop gain, $A_{loop}$, can also be described by the equation:

$$A_{loop} = (V_{in}/V_{osc}) * \text{Beta} * A_{error}$$

where:
$A_{loop}$ = loop gain of the regulator circuit.
$V_{in}$ = input voltage to the regulator.
$V_{osc}$ = peak to peak voltage of the oscillator waveform.
Beta = $V_{feedback}/V_{out}$ = fraction of the output voltage fed back to the error amp.
$A_{error}$ = gain of the error amp.

From this equation it can be seen that increases in input voltage, $V_{in}$, will cause increases in loop gain, $A_{loop}$, if other factors are held constant. If the input voltage increases, the loop gain $A_{loop}$ will also increase.

This variation in loop gain makes it difficult to obtain stable voltage regulation over a wide range of input voltages. At low input voltages, sufficient loop gain is needed to quickly and accurately respond to changes in the output voltage. This same loop gain plus the increase due to increased input voltage, may cause the regulator to become unstable at high input voltages where this loop gain will be excessive. This large loop gain will allow the gain at some high frequency to exceed the level required for oscillation when the phase characteristic crosses 180 degrees. That is, the response of the circuit to output voltage changes will no longer be proportional to the amount of correction needed, and the output voltage will fluctuate about the desired value, rather than be maintained as a stable output voltage or the system could oscillate uncontrollably.

To stabilize the loop gain of the voltage regulator over a wide range of input voltages, and to suppress increases in loop gain as the input voltage increases, several techniques could be used. The gain of the error amp 16, frequency compensation of the error amp, or swing voltage of the oscillator could be adjusted. However, when these stages are built as an integrated circuit it is difficult to access these stages to change their parameters by altering component values. Such changes might also degrade other performance characteristics of the voltage regulator. It is desirable that a method be found to automatically stabilize the regulator as the input voltage changes.

SUMMARY OF THE INVENTION

According to this invention, the stability of a switching voltage regulator is improved by control of the loop gain by the shape of the waveform of the oscillator signal $V_{osc}$. An improved oscillator waveform automatically functions to suppress the increase in loop gain due to increases in the input voltage $V_{in}$, thus improving stability over a wider range of input voltages.

The improved oscillator waveform has an increasing slope as it rises. This produces a waveform of concave shape. The waveform has a greater magnitude of slope at the high regions of the oscillator waveform than at the low regions. A preferred embodiment of this waveform is shown in FIG. 3 and FIG. 4. A modified triangle waveform with narrowed peaks is used. With the improved oscillator waveform, the control signals produced by the comparator will be increasingly narrowed as the point at which the error voltage intersects the oscillator waveform rises. Therefore, at higher input voltages, and correspondingly higher error voltage, the control signal pulses produced will be narrowed as compared to the prior art triangle wave as the oscillator waveform. These narrower signals will reduce the activation of the output stage, thereby achieving the object of suppressing the increase in loop gain as the input voltage increases.

A method of producing the modified triangle waveform that has an increasing rate of rise to the waveform toward the waveform peak, and a decreasing rate of fall to the waveform leaving the waveform peak is to create an alternating charge and discharge current and integrating to produce a modified triangle waveform. Another method would be to combine linear and exponential waveforms. The critical requirement is that the waveform produce narrowed control signals at higher input voltages, reducing the responsiveness of the regulator at higher input voltages.

Pulse width modulation incorporating this invention is achieved by generating the modified oscillator signal, comparing the modified oscillator signal to an error signal, and switching a comparator to generate an control signal when the modified oscillator signal exceeds the error signal.

Voltage regulation with improved stability incorporating this invention is achieved by establishing a feedback control loop from the regulator output to the input of an error amp, comparing the error signal with a modified oscillator signal incorporating this invention to produce a control signal of varying pulse width corresponding to the level of the error signal, and switching the output stage with this control signal.

DESCRIPTION OF THE PREFERRED EMBODIMENT

According to this invention, the stability of a switching voltage regulator is improved by control of the loop gain by the shape of the waveform of the oscillator signal. An improved oscillator waveform automatically functions to suppress the increase in loop gain due to increases in the input voltage increases, thus improving stability over a wider range of input voltages.

In a preferred embodiment of this invention, a modified triangle waveform with narowed peaks is used as the oscillator signal in a pulse width modulator or switching voltage regulator.

Figure 3:
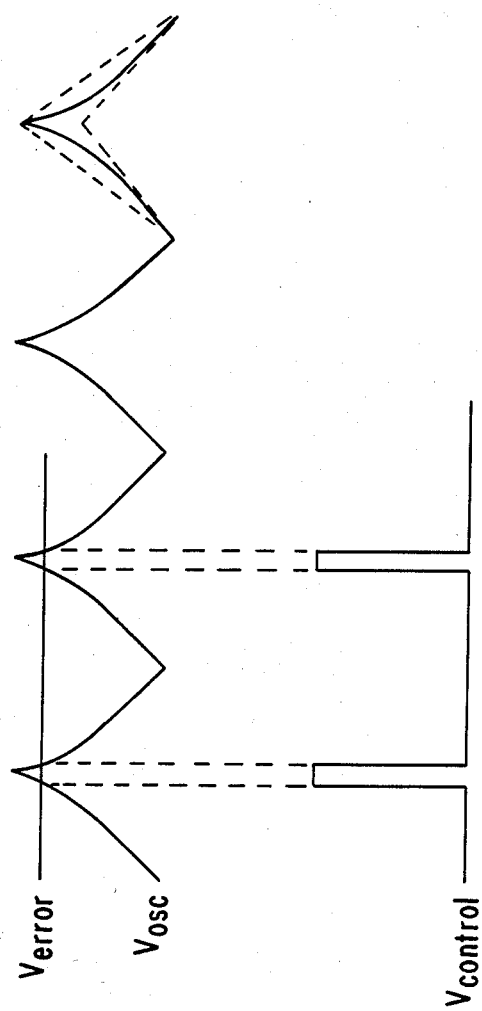
FIG. 3 shows the signals at the comparator including the modified oscillator signal in accordance with this invention.

FIG. 3 shows the signals at the comparator including the modified oscillator signal in accordance with this invention. FIG. 3 shows the input signals $V_{error}$ and $V_{osc}$, and the output signal $V_{control}$. The oscillator signal $V_{osc}$ incorporates this invention, and FIG. 3 shows the resultant narrowing of the control signal $V_{control}$ pulses.

Figure 2:
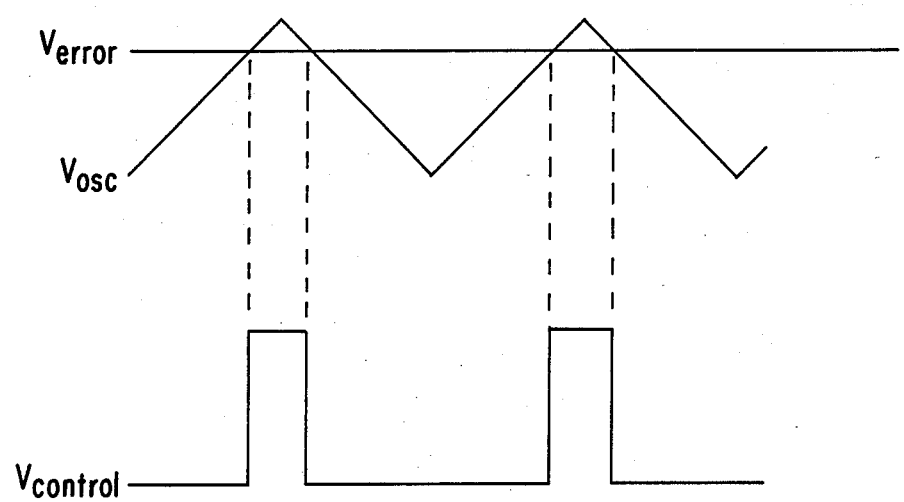
FIG. 2 shows the signals at the comparator in the circuit of FIG. 1.

A conventional system would use a linear triangle wave as the oscillator signal $V_{osc}$ as is shown in FIG. 2. In this invention, as shown in FIG. 3, the oscillator signal $V_{osc}$ triangle wave is modified to have a narrowed peak. The effect of comparing this modified oscillator signal $V_{osc}$ to the error voltage $V_{error}$ is to produce narrower control signal $V_{control}$ pulses as compared to the conventional system. This has the effect of lowering overall loop gain.

Figure 4:
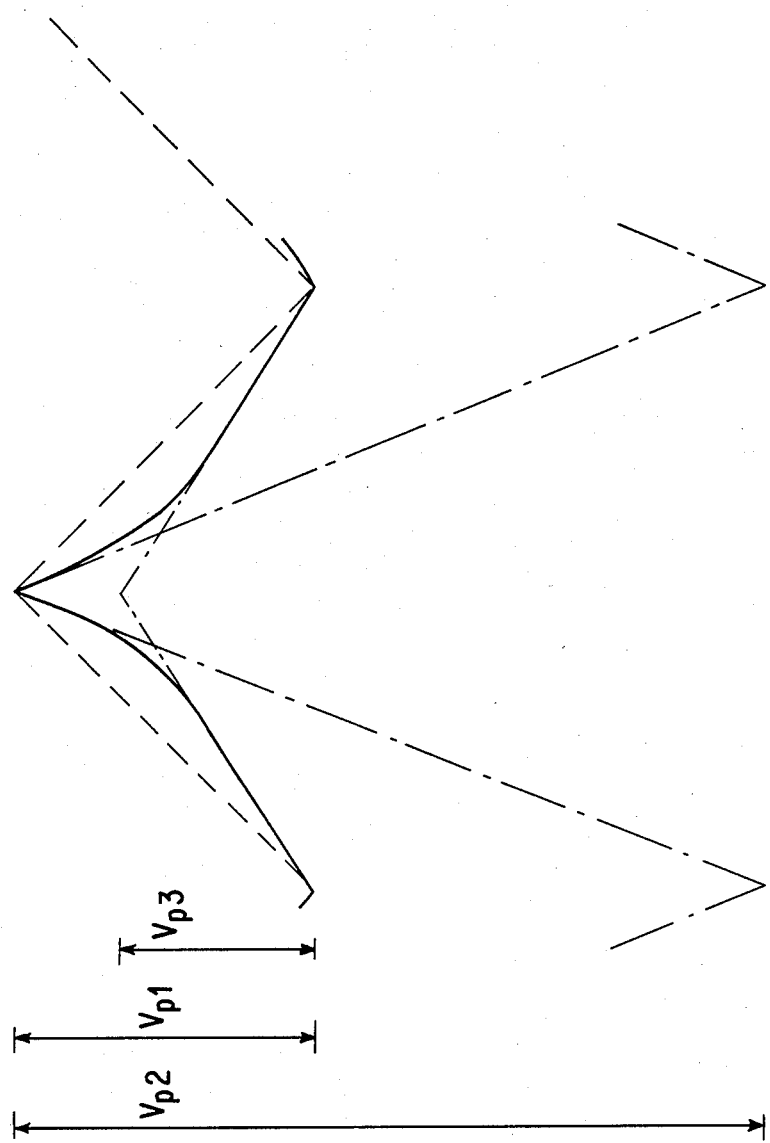
FIG. 4 shows the effective peak to peak voltage at various points on the modified oscillator signal in accordance with this invention.

From another point of view, as shown in FIG. 4, the modified oscillator waveform has a variable effective peak to peak voltage at various points on the modified oscillator waveform, according to the point at which the error voltage $V_{error}$ intersects the oscillator waveform $V_{osc}$. If the intersect point is low, the effective peak to peak voltage of the modified oscillator waveform $V_{osc}$ is low like $V_{p3}$. A conventional linear triangle wave would have had a somewhat larger effective peak to peak voltage like $V_{p1}$. If the intersect point is high, the effective peak to peak voltage of the modified oscillator waveform $V_{osc}$ is large like $V_{p2}$. This large effective peak to peak voltage gives reduced loop gain $A_{loop}$ at that point on the modified oscillator waveform $V_{osc}$. Therefore the loop gain varies and its increase is suppressed at the high effective peak to peak voltage point.

Figure 5:
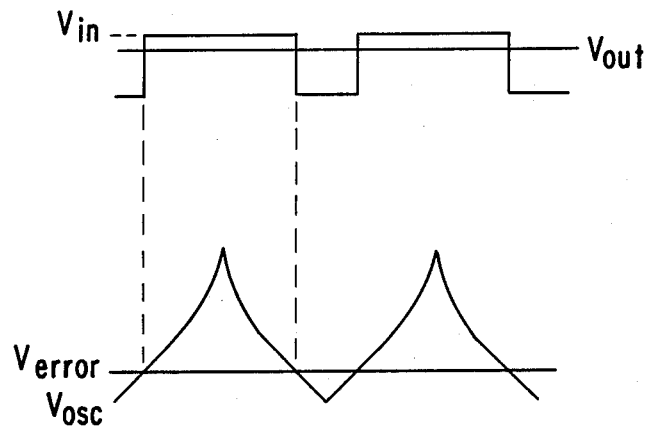
FIG. 5 shows the voltage regulator signals at low input voltage.
Figure 6:
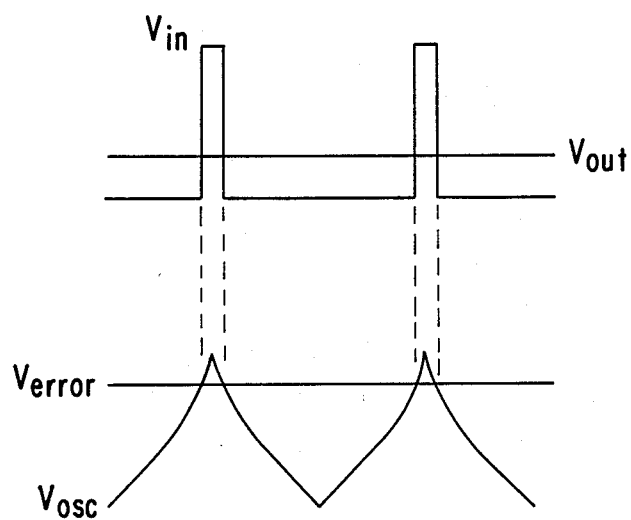
FIG. 6 shows the voltage regulator signals at high input voltage.

FIGS. 5 and 6 show how this modified oscillator waveform functions at low and high input voltages. FIG. 5 shows the operation at a low input voltage. The input voltage is switched on during the long periods in which the oscillator waveform exceeds the error signal to produce the resultant smoothed average output voltage. At this operating point the comparator is operating on the essentially linear lower portion of the oscillator waveform. FIG. 6 shows the operation at a high input voltage. To produce the same resultant smoothed average output voltage, the input voltage will be switched for short periods when the oscillator waveform peaks exceed the higher error signal.

Figure 7:
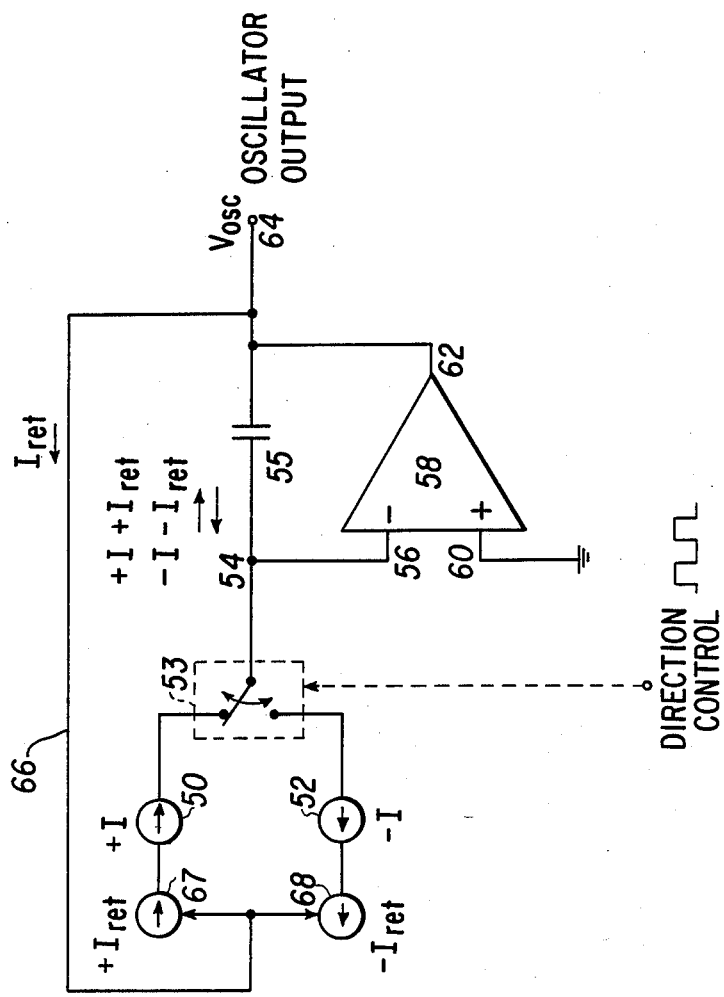
FIG. 7 shows a block diagram of an oscillator circuit for generating the modified oscillator signal of this invention.

FIG. 7 shows a block diagram of an oscillator circuit for producing the modified oscillator signal of this invention.

The oscillator includes a first source of current 50 of magnitude $+I$, and a second source of current 52 of opposite direction $-I$. The current sources are alternately selected as a charge or discharge current by a switch 53 to appear on node 54. The switch is controlled by a direction control which switches at the frequency of operation selected for the oscillator.

The current appearing at node 54 is applied to the first plate of an integration capacitor 55 and to a first input 56 of an inverting integration op amp 58. The second input 60 of the inverting integration op amp 58 is connected to ground or a low reference voltage. The output 62 of the inverting integration op amp 58 provides the oscillator signal $V_{osc}$ and is connected to an oscillator output point 64 and to the second plate of the integration capacitor 55.

A return connection 66 returns a return signal $I_{ret}$ to the first current source 50 and second current source 52. The return signal $I_{ret}$ is developed as a fractional portion of the oscillator signal $V_{osc}$. As the oscillator signal $V_{osc}$ increases, the return signal $I_{ret}$ will increase. As the oscillator output $V_{osc}$ decreases, the return signal $I_{ret}$ will decrease. The return signal $I_{ret}$ carried by the return connection 66 is added as a parallel, supplemental current source 67 to the first source of current 50, and added in an opposite direction as a parallel, supplemental current source 68 to the second source of current 52. Therefore, the current appearing at node 54 will alternate between $+I+I_{ret}$ and $-I-I_{ret}$.

For the inverting integrator circuit shown in FIG. 7, the integration of the $-I$ current generates the rising portion of a triangle waveform. The integration of the $+I$ current generates the falling portion of a triangle waveform. The integration of the $-I_{ret}$ current adds the increased peak to the rising portion of the oscillator waveform $V_{osc}$. The integration of the $+I_{ret}$ generates the decreasing fall from the peak of the oscillator waveform $V_{osc}$.

Figure 8:
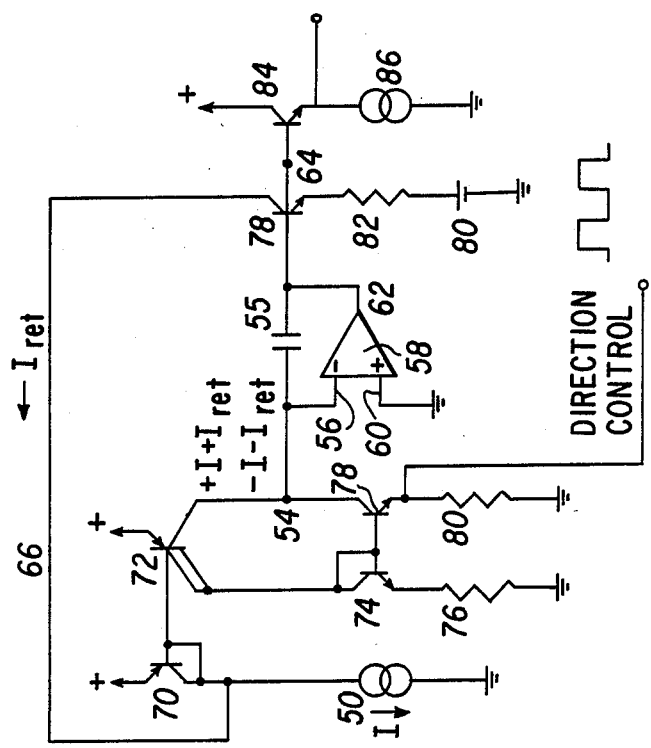
FIG. 8 shows a detailed schematic of an oscillator circuit for generating the modified oscillator signal of this invention.

FIG. 8 shows a detailed schematic of an oscillator circuit for producing the modified oscillator signal of this invention. Where possible, similar components are given similar numbers as in FIG. 7.

The oscillator has a first source of current 50 of magnitude $+I$. This current is established from a supply voltage through a transistor 70 and current sink to a low potential. This current is mirrored from transistor 70 to transistor 72, and is multiplied by a factor of two by making transistor 72 of twice the size of transistor 70. This multiplied current constitutes a second source of current flowing from a supply voltage through transistors 72 and 74 and resistor 76. A switch controlled by a pulse train from a direction control is formed by transistor 78 and resistor 80, and the switch controls the application of the first or second sources of current to node 54.

The integration capacitor 55 and inverting integration op amp 58 are as previously described in FIG. 7. Connected to the oscillator output 64 is a return connection 66 from a transistor 78 to the first source of current 50. The return signal $I_{ret}$ is developed from the oscillator output 64 by transistor 78, and resistor 82 and voltage reference 80. As the oscillator output $V_{osc}$ increases, the return signal $I_{ret}$ will increase. As the oscillator output $V_{osc}$ decreases, the return signal $I_{ret}$ will decrease. The return signal $I_{ret}$ supplements the first source of current 50. This supplemented current is mirrored by the connection between the bases of transistors 70 and 72, and the current is multiplied by a factor of two by making transistor 72 of twice the size of transistor 70. This multiplied and supplemental current will appear in the second source of current established by transistors 72 and 74 and resistor 76. Therefore, the current at node 54 alternates between $+I+I_{ret}$ and $-I-I_{ret}$.

A buffer amplifier stage composed of a transistor 84 and biasing current source 86 is connected to oscillator output 64 to drive the following stages using the modified oscillator signal.

Figure 1:
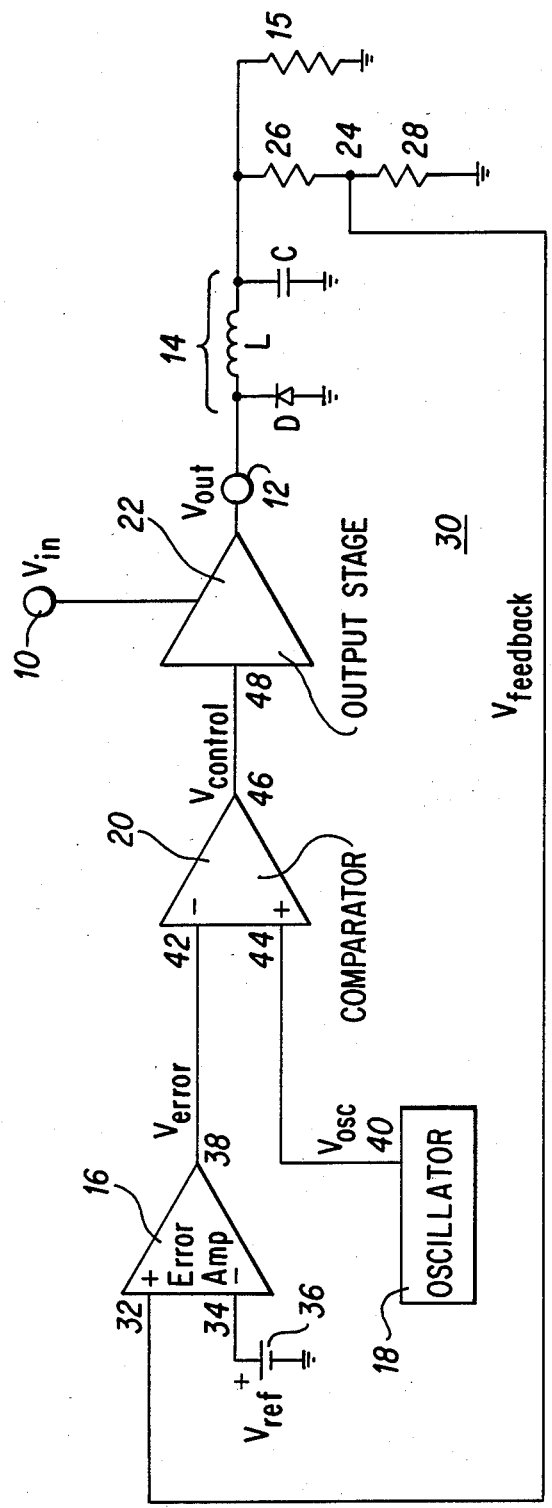
FIG. 1 shows a block diagram of a switching voltage regulator known in the art.

This circuit will generate the modified triangle waveform with narrowed peaks shown as $V_{osc}$ in FIG. 3 and FIG. 4. This waveform will provide the advantages of narrowed control signal $V_{control}$ pulses as previously described. This oscillator can be incorporated in a voltage regulator as previously described in FIG. 1 to obtain a voltage regulator with the advantages of improved loop gain stability. The incorporation of this invention can reduce the increase in loop gain by one-half as the input voltage increases from 5 to 30 volts.

Other methods of producing piece-wise or curved waveforms can be combined to produce a waveform with suitable characteristics. The waveform characteristics could also be calculated and stored for reference by a voltage regulator rather than producing the waveform during operation.

Other embodiments of this invention could use other shapes of oscillator waveforms. A voltage regulator using a sawtooth waveform as the oscillator waveform could be improved by using a "peaked" or narrowed sawtooth waveform with an increasing rate of rise during the rising portion of the sawtooth. This would result in narrowed control signal pulses as compared to a conventional straight sawtooth waveform. This narrowing would help suppress increases in loop gain as the input voltage increases, and stabilize the operation of the voltage regulator.

Other features and advantages of this invention should be apparent from further consideration of the drawings, specification and claims, with the scope of this invention being limited only by the following claims.

I claim:

1. In a switching voltage regulator producing an output voltage from an input voltage, a method of reducing the increase of loop gain of the voltage regulator with increased input voltage comprising:

producing a repeating waveform having increased magnitude of slope at high levels compared to the magnitude of slope at low levels;

producing an error signal as a fractional portion of the output voltage;

activating an output stage to supply output voltage when the repeating waveform exceeds the error signal.

2. A method as in claim 1 wherein the shape of the repeating waveform further comprises:

an increasing rate of rise during rising portions of the repeating waveform, thereby having waveform peaks of narrow width at high levels.

3. A switching voltage regulator producing an output voltage from an input voltage comprising:

an oscillator producing a repeating concave waveform having an increasing rate of rise during rising portions of the repeating waveform;

means to develop an error signal from the output voltage;

a comparator receiving the repeating waveform and error signal, and producing an output when the repeating waveform exceeds the the error signal; and an output stage receiving the comparator output and producing the output voltage.

4. A switching voltage regulator as in claim 3 wherein the oscillator further comprises a current source of alternating polarity coupled to an integrator.

5. A switching voltage regulator as in claim 3 wherein the oscillator further comprises;

a current source;

an integrator with input and output terminals;

a return signal connection;

wherein the current source is coupled to the integrator input, the integrator output is coupled to the return signal connection, and the return signal connection is coupled to modify the magnitude of the current source.

* * * * *